United States Patent
Choi et al.

(10) Patent No.: US 10,254,173 B2
(45) Date of Patent: Apr. 9, 2019

(54) ENVIRONMENTAL SENSOR

(71) Applicant: THE REGENTS OF THE UNIVERSITY OF MICHIGAN, Ann Arbor, MI (US)

(72) Inventors: Myungjoon Choi, Ann Arbor, MI (US); Dennis Sylvester, Ann Arbor, MI (US); David T. Blaauw, Ann Arbor, MI (US)

(73) Assignee: THE REGENTS OF THE UNIVERSITY OF MICHIGAN, Ann Arbor, MI (US)

( * ) Notice: Subject to any disclaimer, the term of this patent is extended or adjusted under 35 U.S.C. 154(b) by 408 days.

(21) Appl. No.: 15/335,902

(22) Filed: Oct. 27, 2016

(65) Prior Publication Data

US 2017/0122815 A1 May 4, 2017

Related U.S. Application Data

(60) Provisional application No. 62/247,783, filed on Oct. 29, 2015.

(51) Int. Cl.
*G11C 7/06* (2006.01)
*G11C 7/12* (2006.01)
(Continued)

(52) U.S. Cl.
CPC .................. *G01K 1/20* (2013.01); *G01K 7/00* (2013.01); *G01K 7/01* (2013.01); *G01K 13/00* (2013.01);
(Continued)

(58) Field of Classification Search
CPC .. H03K 3/012; G11C 7/12; G11C 7/06; G05F 3/16; G05F 3/18; G05F 3/22; G05F 3/30;
(Continued)

(56) References Cited

U.S. PATENT DOCUMENTS

| | | | | |
|---|---|---|---|---|
| 2008/0106954 A1* | 5/2008 | Sinha | ........................ | G11C 7/04 365/194 |
| 2018/0174640 A1* | 6/2018 | Gupta | ...................... | G11C 7/04 |

OTHER PUBLICATIONS

M. Choi et al "A 23 pW, 780ppm/°C Resistor-less Current Reference Using Subthreshold MOSFETS" IEEE 40$^{th}$ European Solid State Circuits Conference (2014).
(Continued)

*Primary Examiner* — Arnold M Kinkead
(74) *Attorney, Agent, or Firm* — Kelly Kordzik; Matheson Keys & Kordzik PLLC

(57) ABSTRACT

An environmental sensor implementing a sleep mode timer with an oscillator circuit suitable for low power applications is presented. The oscillator circuit includes a plurality of timer stages cascaded in series with each other. Each timer circuit includes a plurality of transistors and operates to output two voltages with opposite polarities, such that the polarities of the two voltages oscillate periodically based on leakage current in the plurality of transistors. Each timer circuit further includes one or more tuning transistors that operate to adjust a frequency at which the polarities of the voltages oscillate. A complementary-to-absolute temperature ("CTAT") voltage generator is configured to receive a regulated voltage and supply a bias voltage to the one or more tuning transistors in each of the plurality of timer circuits, where the CTAT voltage generator adjusts the bias voltage linearly and inversely with changes in temperature.

20 Claims, 2 Drawing Sheets

(51) Int. Cl.
| | |
|---|---|
| H03L 1/00 | (2006.01) |
| H03L 1/02 | (2006.01) |
| H03K 3/012 | (2006.01) |
| G01K 1/20 | (2006.01) |
| G01K 7/00 | (2006.01) |
| G01K 7/01 | (2006.01) |
| G05F 1/56 | (2006.01) |
| G05F 3/16 | (2006.01) |
| G05F 3/18 | (2006.01) |
| G05F 3/22 | (2006.01) |
| G05F 3/24 | (2006.01) |
| G05F 3/30 | (2006.01) |
| H03K 3/03 | (2006.01) |
| G01K 13/00 | (2006.01) |
| H03K 3/011 | (2006.01) |

(52) U.S. Cl.
CPC .............. *G05F 1/56* (2013.01); *G05F 3/16* (2013.01); *G05F 3/18* (2013.01); *G05F 3/22* (2013.01); *G05F 3/242* (2013.01); *G05F 3/245* (2013.01); *G05F 3/247* (2013.01); *G05F 3/30* (2013.01); *G11C 7/06* (2013.01); *G11C 7/12* (2013.01); *H03K 3/011* (2013.01); *H03K 3/012* (2013.01); *H03K 3/0315* (2013.01); *H03L 1/00* (2013.01); *H03L 1/02* (2013.01)

(58) Field of Classification Search
CPC ............ G05F 3/245; G05F 3/247; G05F 1/56; H03M 1/00
USPC .................... 331/176, 57; 327/293, 291, 513
See application file for complete search history.

(56) References Cited

OTHER PUBLICATIONS

G. Chen et al "Millimeter-Scale Nearly Perpetual Sensor System With Stacked kBattery and Solar Cells", IEEE International Solid-State Circuits Conference (2010).

* cited by examiner

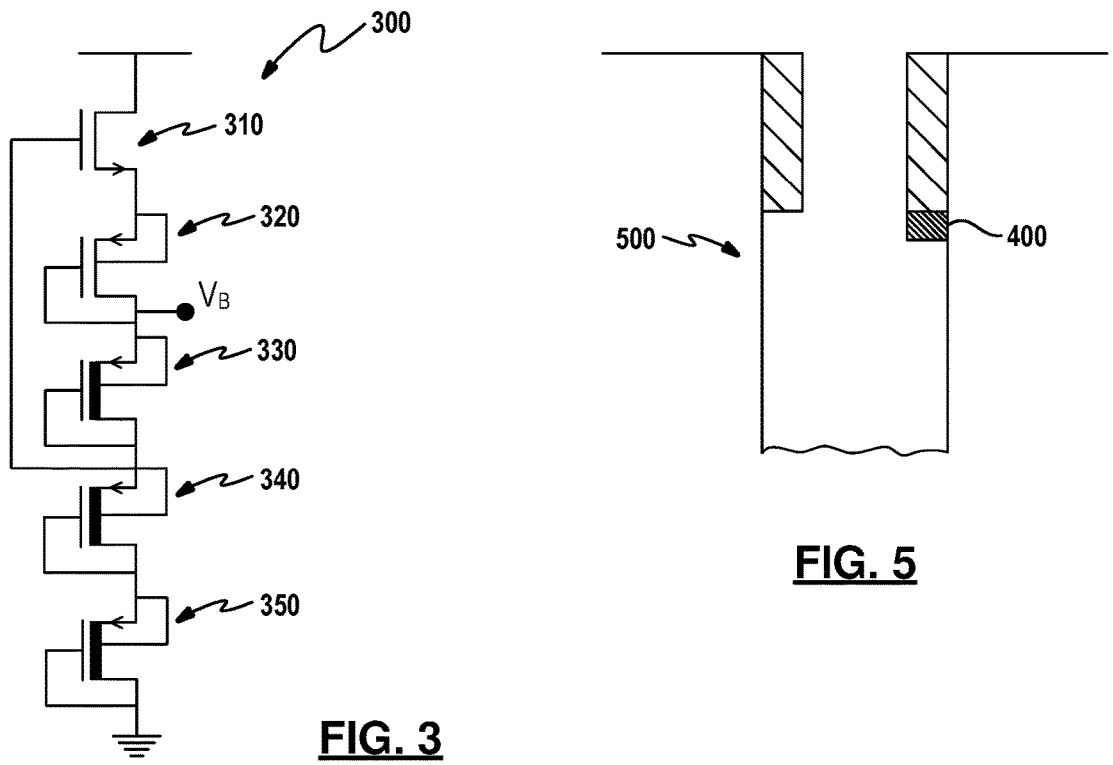
FIG. 3
FIG. 5
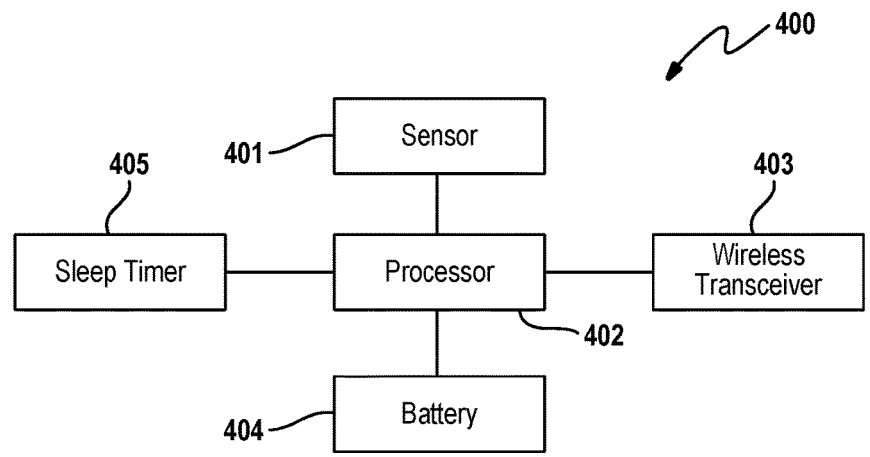
FIG. 4

ENVIRONMENTAL SENSOR

CROSS-REFERENCE TO RELATED APPLICATIONS

This application claims the benefit of U.S. Provisional Application No. 62/247,783, filed on Oct. 29, 2015. The entire disclosure of the above application is incorporated herein by reference.

FIELD

The present disclosure relates to a sensor for utilization within oil or gas exploration, and particularly, to an oscillator circuit utilized as a temperature compensated sleep mode timer within such a sensor.

BACKGROUND

For energy-constrained systems like wireless sensor nodes, ultra-low power clock generation is important. Such sensor nodes may operate in an active mode and a sleep mode. In sleep mode, a timer is required to know when to wake up the system. This timer should consume ultra-low power. Additionally, many industrial applications require the wireless sensor nodes to function reliably over varying temperatures. Meeting such a temperature stability with a limited power budget is therefore important for building wireless sensor nodes.

This section provides background information related to the present disclosure, which is not necessarily prior art.

DRAWINGS

The drawings described herein are for illustrative purposes only of selected embodiments and not all possible implementations, and are not intended to limit the scope of the present disclosure.

FIG. 3 is a schematic of an exemplary CTAT generator for utilization within the oscillator circuit of FIG. 1;

FIG. 4 is a block diagram of an exemplary temperature sensor using the oscillator circuit of FIG. 1; and FIG. 5 illustrates an example utilization of a sensor deployed within a wellbore in accordance with embodiments of the present disclosure.

Corresponding reference numerals may indicate corresponding parts throughout the several views of the drawings.

DETAILED DESCRIPTION

Exemplary embodiments will now be described more fully with reference to the accompanying drawings.

Figure 1:
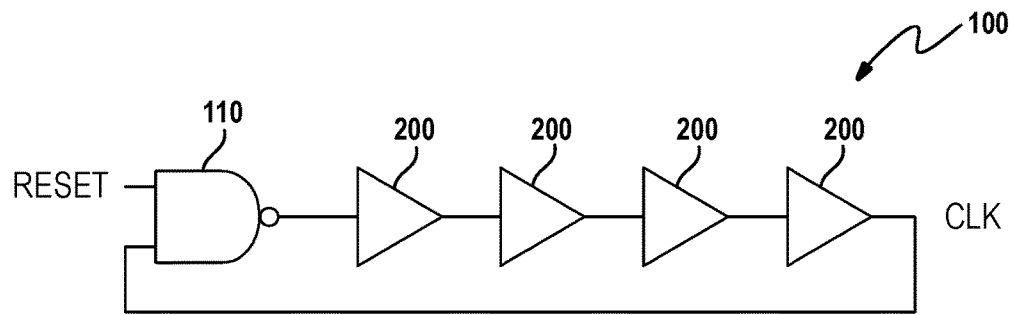
FIG. 1 is a schematic of an exemplary oscillator circuit configured in accordance with embodiments of the present invention.

FIG. 1 depicts an exemplary oscillator circuit 100. The oscillator circuit 100 may generally include five timer stages cascaded as a chain, thereby forming an oscillator. In an example embodiment, the oscillator circuit includes four timer circuits 200 and a NAND stage 110 as shown. The NAND stage 110 provides a reset functionality of the oscillator. In other embodiments, the oscillator circuit may include five timer circuits 200 cascaded without a reset functionality. The oscillator circuit 100 generates an output having an oscillating waveform, such as a sine or square wave. Each timer stage 200 is biased with a linear CTAT (complementary-to-ambient-temperature) voltage generator as further described below. While five stages are shown in the oscillator circuit 100, the oscillator circuit 100 may be comprised of more or less odd numbers of stages.

Figure 2:
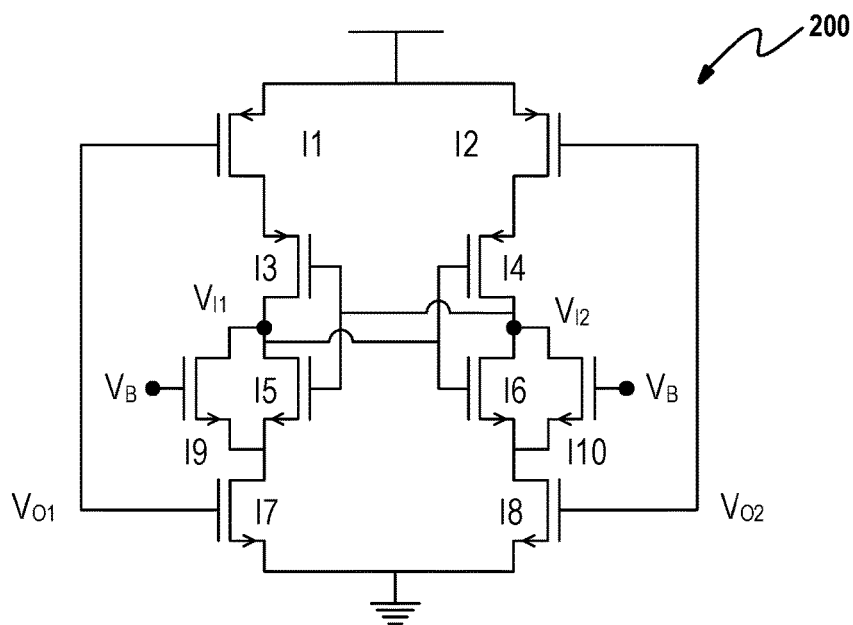
FIG. 2 is a schematic of an exemplary implementation of a timer circuit for utilization within the oscillator circuit of FIG. 1.

FIG. 2 depicts an exemplary implementation of a timer stage 200 (also referred to herein as a timer circuit), which may be used in the oscillator circuit 100. In the example embodiment, each timer circuit 200 includes a pair of inverters cross-coupled to each other. More specifically, the pair of inverters includes transistors I3, I4, I5, and I6 (e.g., MOSFETs). Each timer circuit 200 further includes a pair of high side transistors I1, I2 coupled in between a high side of a supply voltage and the pair of inverters, as well as a pair of low side transistors I7, I8 coupled in between the pair of inverters and a low side of the supply voltage. Such transistors of the timer circuit 200 operate in the subthreshold region.

In operation, the timer circuit 200 outputs two voltages with opposite polarities at nodes $V_{O2}$ and $V_{f2}$. When nodes $V_{O1}$ and $V_{f1}$ are high, and nodes $V_{O2}$ and $V_{f2}$ are low, transistors I1, I4, I5, and I8 are turned off, and the remainder of the transistors I2, I3, I6, and I7 are turned on. The subthreshold leakages of transistors I1 and I5 are competing with each other, and because transistor I5 has a larger drain-to-source voltage $V_{DS}$, a current flowing out of node $V_{f1}$ is higher than a current flowing into node $V_{f1}$. Node $V_{f1}$ will eventually become low. At the same time, transistors I4 and I8 are competing with each other, and a current flowing into voltage $V_{f2}$ is larger than a current flowing out of node $V_{f2}$, because the voltage $V_{DS}$ of transistor I4 is larger than the voltage $V_{DS}$ of transistor I8. Node $V_{f2}$ will eventually become high. The same procedure repeats with the opposite polarities every half clock cycle within the timer circuit 200. Thus, the polarity of output voltages oscillates periodically based on the leakage current of the transistors, such that its frequency and power can be very low. While reference has been made to a particular topology for the timer circuit 200, other types of timer circuits which operate on a basis of subthreshold leakage current are also contemplated by this disclosure.

To adjust a frequency at which the polarities of the output voltages oscillate, two tuning transistors I9, I10 (e.g., NMOS devices) are added to the timer circuit 200. One of the two tuning transistors is coupled to an output of one of the inverters (e.g., node $V_{f1}$) and the other of the two tuning transistors is coupled to the output of the other inverter in the pair of inverters (e.g., node $V_{f2}$). Specifically, each tuning transistor is coupled between an output of the inverter and the low side of the inverter. The tuning transistors operate to create a larger current path which in turn increases current flowing out of nodes $V_{f1}$ and $V_{f2}$ during the operation, making the transition of states faster.

The bias voltage $V_B$ for each tuning transistor I19, I10 is supplied by a CTAT voltage generator 300 (e.g., seen in FIG. 3). The CTAT voltage generator 300 is configured to receive a regulated voltage and supply the bias voltage $V_B$ to each tuning transistor in each of the plurality of timer circuits 200. The bias voltage adjusts linearly and inversely with changes in temperature. The higher voltage $V_B$ is, the faster the transition, and thus the frequency of the oscillator 100. As temperature increases, voltage $V_B$ becomes linearly lower so that the intrinsic temperature dependency of the timer circuit 200 is compensated.

FIG. 3 depicts an exemplary complementary-to-absolute temperature ("CTAT") generator circuit 300. In the exemplary embodiment, the CTAT generator 300 is a stack of diode-connected transistors, which produce a linear CTAT bias voltage, $V_B$. More specifically, the stack of diode-connected transistors includes an n-channel MOSFET 310 followed by four p-channel MOSFETs 320, 330, 340, 350, where the drain terminal of the n-channel MOSFET 310 is configured to receive a regulated voltage. The $V_{CTAT\_C}$ slope and temperature coefficient of the output current can be controlled by changing transistor width ratio of nominal-Vth PMOS and high-Vth PMOS in the CTAT generator 300. Further details regarding the example CTAT generator 300 are described by M. Choi et al. in "A 23 pW, 780 ppm/° C. resistor-less current reference using subthreshold MOSFETs," 40th European Solid State Circuits Conference (ESSCIRC), September 2014, pp. 119-122, which is incorporated in its entirety by reference.

The bias voltage $V_B$ of the CTAT generator 300 biases the gate of the tuning transistors I9, I10 in each timer stage 200 of the oscillator circuit 100.

During operation, the bias voltage $V_B$ decreases linearly as temperature increases. The top NMOS transistor 310 provides supply voltage regulation. The PMOS transistor 320 is a nominal Vth device, and the other PMOS transistors 330, 340, 350 are high Vth devices. This combination of different types of devices provides a higher temperature coefficient, which is needed for temperature compensation of oscillator frequency. It is also noted that the CTAT generator 300 does not employ a resistor. While reference has been made to a particular CTAT generator circuit, other arrangements for the CTAT generator 300 also fall within the scope of this disclosure.

FIG. 4 depicts an exemplary environmental sensor 400, which incorporates the oscillator circuit 100. The sensor 400 may include some sort of well-known environmental sensor device 401, a processor 402, a wireless transceiver 403, a battery 404, and a sleep mode timer 405. The sensor 100 has two operation modes: active mode and sleep mode. In active mode, the sensor has full functionalities, such as measuring environmental information, storing and processing data and RF transmission. In sleep mode, most of the sensor components are in a low power mode or powered down to save energy.

The sleep mode timer 405 determines when the sensor 400 operates in an active mode or a sleep mode. In an example embodiment, the sleep mode timer 405 is configured to wake up the processor 402 and associated circuitry (i.e., trigger an active mode of operation from a low power mode of operation). In the active mode, the sensor device 401 operates to detect and/or measure an amount of some sort of physical parameter associated with the environment in which the sensor 400 has been deployed (e.g., a temperature measurement). After some fixed period of time, the sensor returns to a sleep mode.

In the example embodiment, the sleep mode timer 405 employs the oscillator circuit 100 for the wake up function. The oscillator circuit 100 generates a clock signal. When the clock signal reaches a preset value, a signal output by the sleep mode timer 405 to the processor 402 goes high (or low) and thereby enables the processor 402. The frequency at which this trigger occurs should not change much over variations in the temperature of the environment in which the sensor 400 is deployed to maintain a consistent wake-up period. Embodiments of the oscillator circuit 100 reduces the temperature variation by 1.4 times over the temperature range while maintaining power consumption as compared to existing timers. It is readily appreciated that the oscillator circuit 100 may be implemented in other types of sensors as well as other types of low power applications.

Referring to FIG. 5, such a sensor 400 may be implemented, for example, in a wellbore 500 for sensing various parameters, such as temperature, pressure, etc. Such a wellbore 500 may be utilized in the exploration and extraction of oil and/or gas from a subterranean formation, which can experience a wide variety of temperatures depending upon the depth in which the sensor 400 is deployed in the welbore 500. Such a sensor 400 may communicate with equipment (not shown) on the surface using a wire line, or using wireless communications via the wireless transceiver 403.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

As used herein, the term "and/or" when used in the context of a listing of entities, refers to the entities being present singly or in combination. Thus, for example, the phrase "A, B, C, and/or D" includes A, B, C, and D individually, but also includes any and all combinations and subcombinations of A, B, C, and D.

What is claimed is:

1. An oscillator circuit, comprising:
a plurality of timer circuits cascaded in series with each other, wherein each timer circuit is comprised of a plurality of transistors and operates to output two voltages with opposite polarities, such that the polarities of the two voltages oscillate periodically based on leakage current in the plurality of transistors;
wherein each timer circuit further includes one or more tuning transistors that operate to adjust a frequency at which the polarities of the two voltages oscillate; and
a complementary-to-absolute temperature ("CTAT") voltage generator configured to receive a regulated voltage and supply a bias voltage to the one or more tuning transistors in each of the plurality of timer circuits, where the CTAT voltage generator adjusts the bias voltage linearly and inversely with changes in temperature.

2. The oscillator circuit of claim 1 wherein each timer circuit includes a pair of inverters cross-coupled to each other.

3. The oscillator circuit of claim 2 wherein each timer circuit further includes a first tuning transistor electrically coupled to an output of a first inverter in the pair of inverters and a second tuning transistor electrically coupled to an output of a second inverter in the pair of inverters.

4. The oscillator circuit of claim 1 wherein the plurality of transistors and the one or more tuning transistors in each timing circuit operate only in a subthreshold region.

5. The oscillator circuit of claim 1 wherein the CTAT voltage generator supplies the bias voltage to a gate terminal of each tuning transistor, and wherein the CTAT voltage generator is comprised of transistors operating only in a subthreshold region.

6. The oscillator circuit of claim 1 wherein the CTAT voltage generator is implemented by a stack of diode-connected transistors.

7. The oscillator circuit of claim 1 further comprising a NAND gate arranged in series with the plurality of timer circuits.

8. An oscillator circuit, comprising:
a plurality of timer circuits cascaded in series with each other, wherein each timer circuit includes a pair of inverters cross-coupled to each other and two tuning transistors, such that a first one of the two tuning transistors is coupled to an output of a first inverter in the pair of inverters, and a second one of the two tuning transistors is coupled to an output of a second inverter in the pair of inverters; and
a complementary-to-absolute temperature ("CTAT") voltage generator configured to receive a regulated voltage and supply a bias voltage to each of the two tuning transistors in each of the plurality of timer circuits, where the CTAT voltage generator adjusts the bias voltage linearly and inversely with changes in temperature.

9. The oscillator circuit of claim 8 wherein the pair of inverters in each of the plurality of timer circuits oscillates periodically between states based on leakage current of transistors comprising the pair of inverters.

10. The oscillator circuit of claim 9 wherein the transistors comprising the pair of inverters and the two tuning transistors operate only in a subthreshold region.

11. The oscillator circuit of claim 10 wherein each timer circuit further includes:
a first pair of transistors coupled between a high side of a supply voltage and the pair of inverters; and
a second pair of transistors coupled between the pair of inverters and a low side of the supply voltage.

12. The oscillator circuit of claim 8 wherein the CTAT voltage generator supplies the bias voltage to a gate terminal of each tuning transistor, and wherein the CTAT voltage generator is comprised of transistors operating only in a subthreshold region.

13. The oscillator circuit of claim 8 further comprising a NAND gate arranged in series with the plurality of timer circuits.

14. An environmental sensor comprising:
a sensor device configured to detect, during an active mode of operation, an existence or measure an amount of a physical parameter associated with an environment in which the environmental sensor has been deployed; and
a sleep mode timer configured to wake up the sensor device from a sleep mode of operation to the active mode of operation, wherein the sleep mode timer comprises:
a plurality of timer circuits cascaded in series with each other, wherein each timer circuit is comprised of a plurality of transistors and operates to output two voltages with opposite polarities, such that the polarities of the two voltages oscillate periodically based on leakage current in the plurality of transistors, wherein each timer circuit further includes one or more tuning transistors that operate to adjust a frequency at which the polarities of the two voltages oscillate; and
a complementary-to-absolute temperature ("CTAT") voltage generator configured to receive a regulated voltage and supply a bias voltage to the one or more tuning transistors in each of the plurality of timer circuits, where the CTAT voltage generator adjusts the bias voltage linearly and inversely with changes in temperature.

15. The environmental sensor of claim 14, wherein each timer circuit includes a pair of inverters cross-coupled to each other.

16. The environmental sensor of claim 15, wherein each timer circuit further includes a first tuning transistor electrically coupled to an output of a first inverter in the pair of inverters and a second tuning transistor electrically coupled to an output of a second inverter in the pair of inverters.

17. The environmental sensor of claim 14, wherein the plurality of transistors and the one or more tuning transistors in each timing circuit operate only in a subthreshold region.

18. The environmental sensor of claim 14, wherein the CTAT voltage generator supplies the bias voltage to a gate terminal of each tuning transistor, and wherein the CTAT voltage generator is comprised of transistors operating only in a subthreshold region.

19. The environmental sensor of claim 14, wherein the CTAT voltage generator is implemented by a stack of diode-connected transistors.

20. The environmental sensor of claim 14, further comprising a NAND gate arranged in series with the plurality of timer circuits.

* * * * *